United States Patent [19] [11] 3,916,266

Bennett et al. [45] Oct. 28, 1975

[54] PLANAR PACKAGING FOR INTEGRATED CIRCUITS

[75] Inventors: Marvin Bennett; Carlo Nuccio, both of Poughkeepsie; Charles Wurms, Wappingers Falls, all of N.Y.

[73] Assignee: International Business Machines Corporation, Armonk, N.Y.

[22] Filed: Dec. 13, 1973

[21] Appl. No.: 424,490

[52] U.S. Cl. .......................... 317/100; 317/101 CC
[51] Int. Cl.² .......................................... H02B 1/00
[58] Field of Search ..... 317/101 C, 101 D, 101 CC, 317/100

[56] References Cited

UNITED STATES PATENTS

| | | | |
|---|---|---|---|
| 2,720,578 | 10/1955 | Caffiaux et al. | 317/101 C |
| 2,772,380 | 11/1956 | Andrew | 317/101 R |
| 3,030,553 | 4/1962 | Comntzis | 317/100 |
| 3,527,989 | 9/1970 | Cuzner et al. | 317/100 |
| 3,755,891 | 9/1973 | Muckelroy et al. | 317/101 D |

*Primary Examiner*—David Smith, Jr.
*Attorney, Agent, or Firm*—George O. Saile

[57] ABSTRACT

A package for interconnecting a plurality of integrated circuit chips including a dielectric body having a plurality of intersecting planes and a plurality of metallized interconnection patterns located thereon. Conductive interconnecting lines connected to at least some of said metallized patterns located on different intersecting planes provide inter-plane electrical continuity, and input/output connectors connect to at least one of the metallized patterns for connecting to the outside world.

4 Claims, 6 Drawing Figures

PLANAR PACKAGING FOR INTEGRATED CIRCUITS

BACKGROUND OF THE INVENTION

A continuing attempt is being made to increase the density of integrated circuits. However, this attempt requires concomitant advances in the packaging of the integrated circuit chips. For many applications, it is felt that the planar single level metallurgy package or substrate, whether it be on one or both of the major faces of the substrate, is inadequate to handle increased circuit densities. Accordingly, multi-level packaging technology became a solution to the problem. This approach, of course, is not without its difficulties as the costs and complexities of fabricating multi-level interconnection packages are sometimes a negative factor.

SUMMARY OF THE INVENTION

It is an object of the present invention to provide an interconnection package for integrated circuit chips which can be readily manufactured with the current state of the art techniques, such as, brazing, photolithographic processes, vapor deposition, etc., without requiring complex multi-level processes.

Another object of the present invention is to provide an interconnection package which greatly increases the ease of routing interconnection metallurgy patterns and thus increases the overall package and circuit density.

Another object of the present invention is to provide a high density interconnection pattern metallurgy which can be readily inspected as opposed to being submerged in a multi-layer structure.

A further object of the present invention is to provide an interconnection high density package which is readily repairable in the field and at the manufacturing site, and which facilitates engineering change modifications.

Another object of the present invention is to provide a high density metallized interconnection package which can be easily customized and which can readily accommodate a high number of input/output connections or pins without requiring complex and costly multi-level structures.

An additional advantage of the present invention is to provide a high density interconnection package that is readily compatible with numerous cooling approaches, and which can be mounted on another level of packaging in a variety of configurations.

In accordance with the aforementioned objects of the present invention provides a high density electrical interconnection package for connecting a plurality of integrated circuit chips on a substrate body having a plurality of intersecting planes and a plurality of metallized interconnection patterns located thereon. Interconnection exists between at least some of said metallized patterns located on different intersecting planes for providing inter-plane electrical continuity between the plurality of integrated circuit chips and the input/output connections, which in turn communicate between the multi-planed substrate and higher order or second levels of packaging.

DETAILED DESCRIPTION

Figure 1:
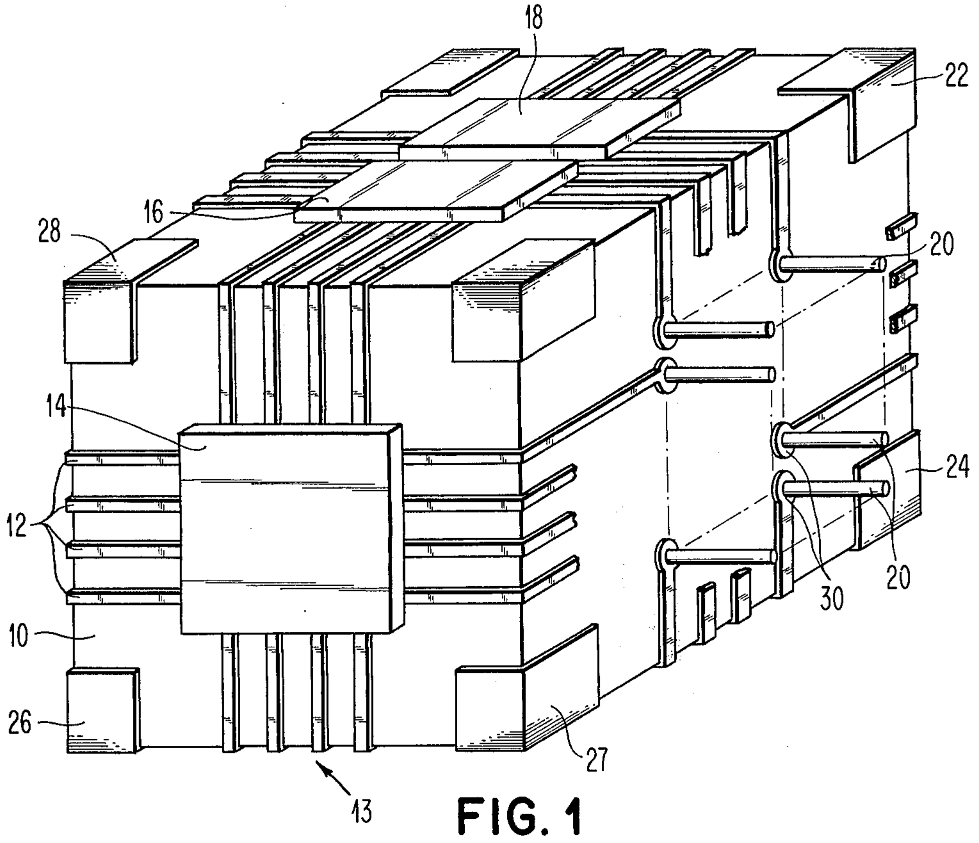
FIG. 1 is a schematic perspective diagram illustrating the high density package for a plurality of integrated circuit chips and more specifically the multi-planar nature of the top surface metallurgy which substantially circumscribes the outer package surface.

Now referring to FIG. 1 which illustrates the preferred embodiment of the present invention, it illustrates a solid six-sided substrate dielectric body 10. Each of the major planar faces of the solid body 10 carries a plurality of metallized interconnection patterns generally depicted at 12. Each of the major surfaces is capable of accommodating a plurality of chips shown generally at 14, 16, and 18, etc. The planar interconnection metallurgy 12 provides electrical continuity between the plurality of chips and also to a plurality of input/output pins schematically represented at 20. Electrical interconnection between major surfaces is accomplished in a plurality of ways, for example, inter-plane connection is constituted by transverse edge connectors shown schematically at 22, 24, 26, 27, and 28 and also by an extension of one planar pattern into another planar surface as indicated at 13.

It is seen that by utilizing the major outer surfaces of the substrate body 10 electrical access between any two given points on the outer surface 10 can be more readily accomplished than in the conventional planar or two-dimensional approach. In the past planar approach, as the density requirements of the interconnection pattern are increased, it becomes substantially impossible to deposit the necessary interconnection lines without upper surface cross-overs or underpasses, or in the extreme case, a multi-level underpass structure. The logical extreme extension of the multi-face solid substrate is of course a sphere which provides the greatest number of independent access routes without requiring a cross-over or underpass. For purposes of illustration, the invention is illustrated as an six-sided block, however, it is to be realized that the outside contour of the substrate body 10 is limited only by the manufacturing constraints of fabricating the same and could be any number sided.

In the preferred embodiment of FIG. 1, the substrate body 10 is constituted by a dielectric body and thus the interconnection pattern 12 can be directly deposited thereon by conventional techniques such as vapor deposition. However, it is realized that a solid non-dielectric inner core having heat dissipation capabilities can be employed by coating its outer surface with a dielectric material and then depositing the metallized interconnection pattern 12 thereon. An additional electrical advantage of employing a metal inner core is its capability of functioning as an internal common ground. The input/output connector pins 20 can be readily connected to their respective metallized land areas 30, for example, by conventional techniques such as by brazing. Even though the maximum number of semiconductor chips is illustrated as two this is not intended to be a limitation as any number can be mounted on a major face.

Figure 2:
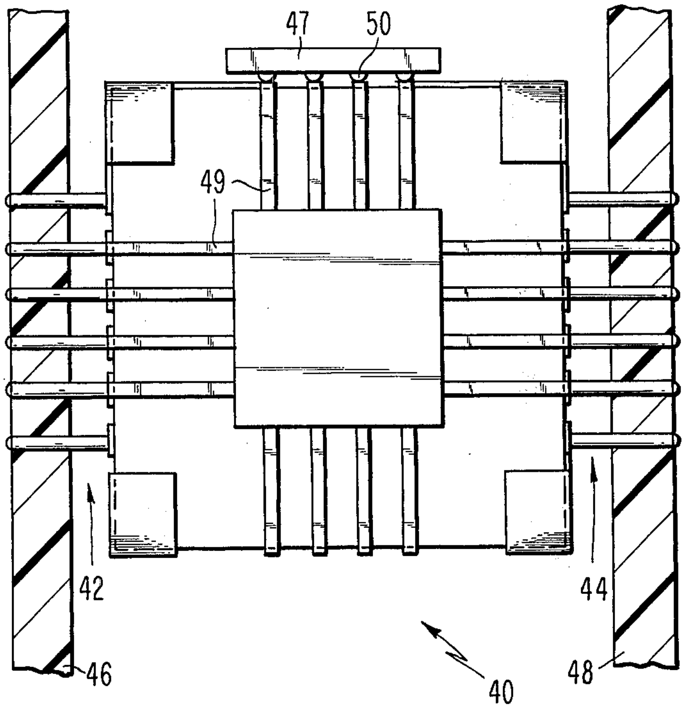
FIG. 2 illustrates in partial cross-section an embodiment similar to the high density interconnection package shown in FIG. 1, and additionally illustrates the ease of adding additional input/output pins to accommodate its marriage with higher order or second levels of packaging.

Now referring to FIG. 2 which is similar to the embodiment shown in FIG. 1, but with the addition that the input/output capacity of the overall package 40 is increased by providing a plurality of input/output connectors 42 and 44 respectively on opposite major faces. This modification not only increases the input/output capability of the package 40 but also facilitates its mounting into a higher order or second level of packaging, illustrated by the vertical dielectric substrates 46 and 48 which in turn accommodate the plurality of pins 42 and 44, respectively. Although not shown, each of the substrate bodies 46 and 48 may carry its own metallized interconnection pattern for communicating between other multi-faced substrates carried therebetween or to other levels of packaging, both not shown. In FIG. 2 the semiconductor chip, only one of which is shown at 47 is connected to associated metallized patterns 49 by means of a plurality of bonds 50. Conventional bonding techniques such as solder reflow, thermocompression, ultrasonic wire etc. can be used to connect individual integrated circuit chips to the metallized pattern.

Figure 3:
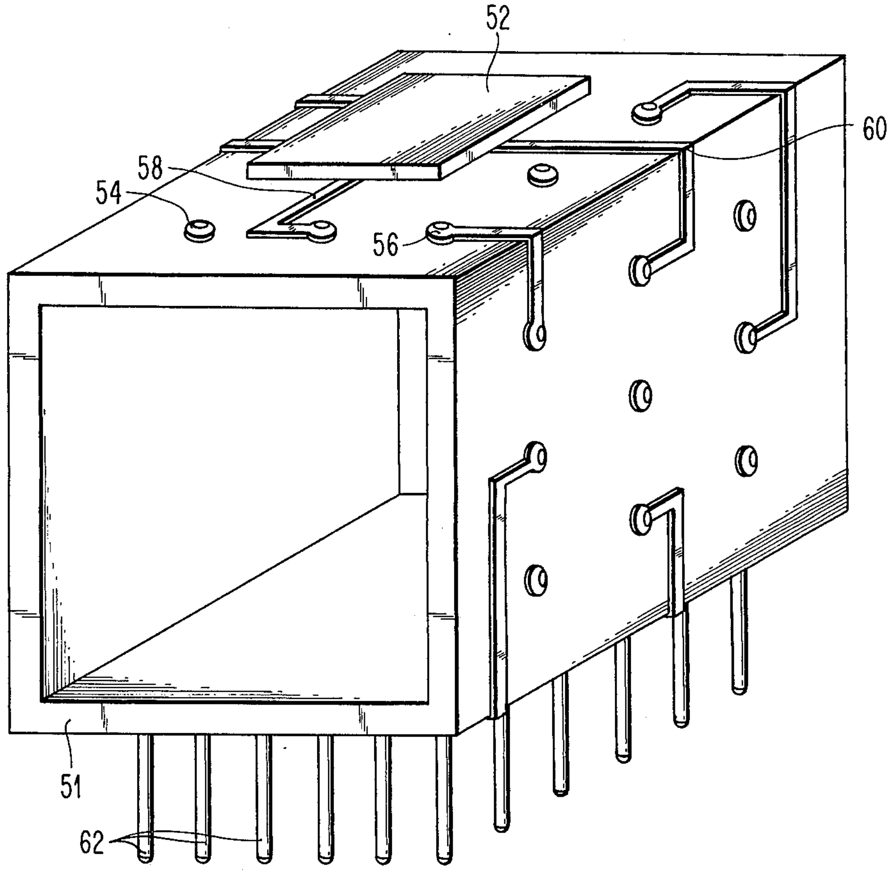
FIG. 3 in a perspective illustrates another embodiment of that shown in FIG. 1 but wherein the multi-faced housing or substrate is a hollow, open-ended structure in which the outer density capability of the package is somewhat diminished, but which in turn allows for various cooling and second level or higher order packaging implementations.

Now referring to FIG. 3, it illustrates another embodiment slightly different than that shown in FIG. 2. In FIG. 3, the substrate 51 comprises an open-ended cage configuration. Again, a plurality of chips, one of which is shown at 52, are mounted at their respective chip site pads, schematically shown at 54, and they in turn connect to planar and transverse metallized patterns generally depicted at 58 and 60. Again, communication to a higher order of packaging is accomplished by means of a plurality of input/output pins 62.

Many techniques are available for fabricating the open-ended dielectric covered cage substrate 50, but one highly considered approach is to employ an extrusion process. In the one version, numerous materials are available such as glass, plastics, ceramics, etc. For the dielectric coated version the inner core is constituted by a suitable metal and any desired dielectric coating is deposited thereover. Later depicted in FIGS. 5 and 6, the hollow substrate body has particular advantages for certain mounting applications and heat sink cooling considerations, although concededly the open-ended version reduces the availability of two surfaces for mounting integrated circuits thereon.

Figure 4:
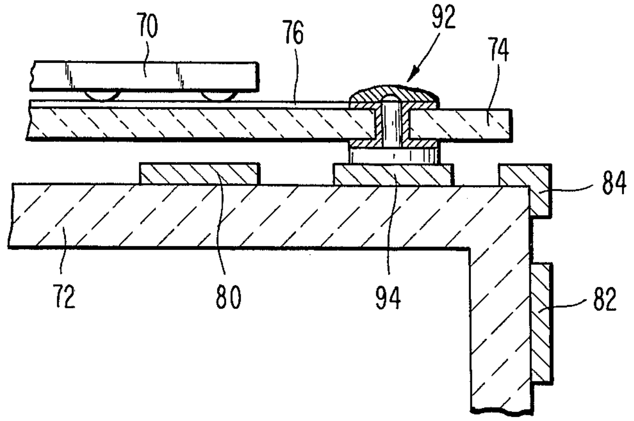
FIG. 4 is a partial cross-sectional view of another embodiment illustrating a different manner of mounting the semiconductor chip by way of an intermediate interconnection member to the basic substrate having the plurality of intersecting planes selectively carrying metallized interconnection patterns thereon.

Now referring to FIG. 4, it illustrates a different manner of mounting the semiconductor chips, such as that shown at 70, to its associated multisurfaced substrate 72. A planar metallized pattern schematically shown at 76 is employed to interconnect the plurality of chips carried by the intermediate 74, which allows latitude in selecting a customized intermediate chip carrying substrate 74. The primary or basic substrate 72, as previously described, carries a plurality of planar metallized interconnection patterns 80 and 82, as well as a transverse connector means 84 for interplane connection. A metallurgical bond interconnection generally depicted at 92 is employed to connect the metallized land pattern 76 to an interconnection pattern 94 carried by the horizontal surface of substrate 72.

Figure 5:
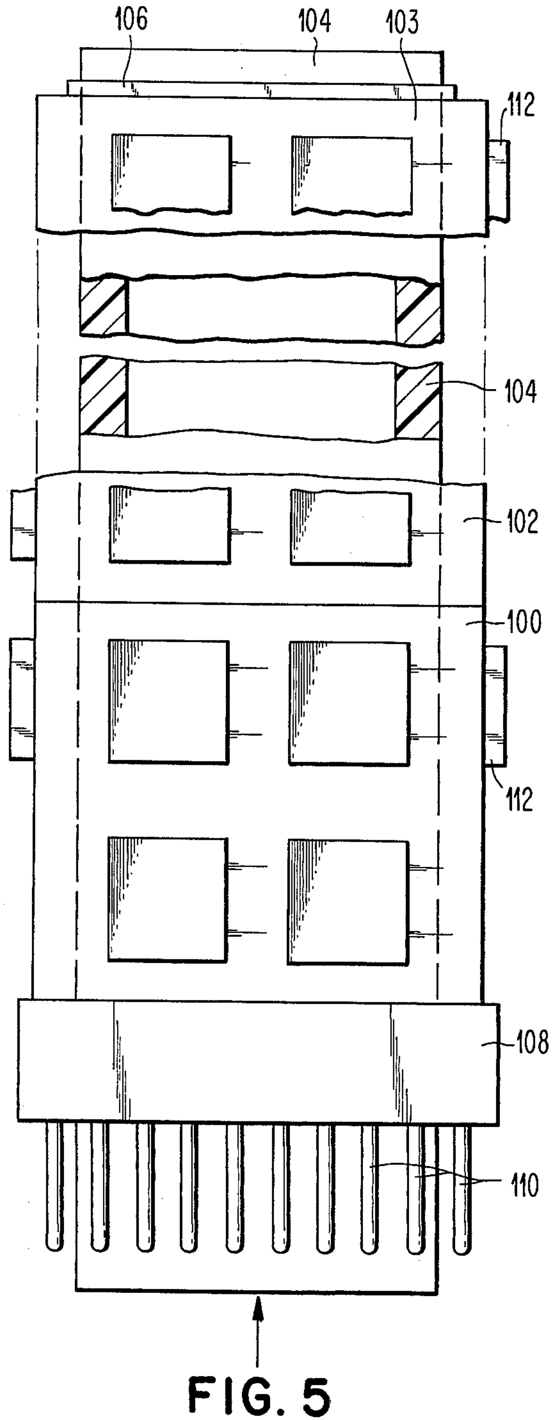
FIG. 5 is a schematic diagram partially broken away illustrating one manner of mounting the open-ended type of substrate illustrated in FIG. 3 to a central heat sink post and its connection to the outside world.

Now referring to FIG. 5, it illustrates a packaging arrangement for the sectionalized type of substrate previously depicted in FIG. 3. In this version, the plurality of sectionalized substrates 100, 102, 103, etc. are slidably mounted on an inner central heat post 104. Interconnection between each of the sectionalized substrates 100, 102, 103 is established by means of any well known techniques, such as connectors, pins, or a variety of bonding methods. The upper flange portion 106 allows the plurality of substrates 100, 102, 103, etc. to be locked into position by means of a lower lock means schematically depicted at 108. Again, a plurality of input/output pins 110 provide further external electrical communication exterior to the stacked configuration. The central post 104 is schematically depicted as being a hollow dielectric type of material, although it also can be fabricated of a heat conductive type member for cooling the integrated circuits carried by the plurality of integrated circuit chips 112.

Figure 6:
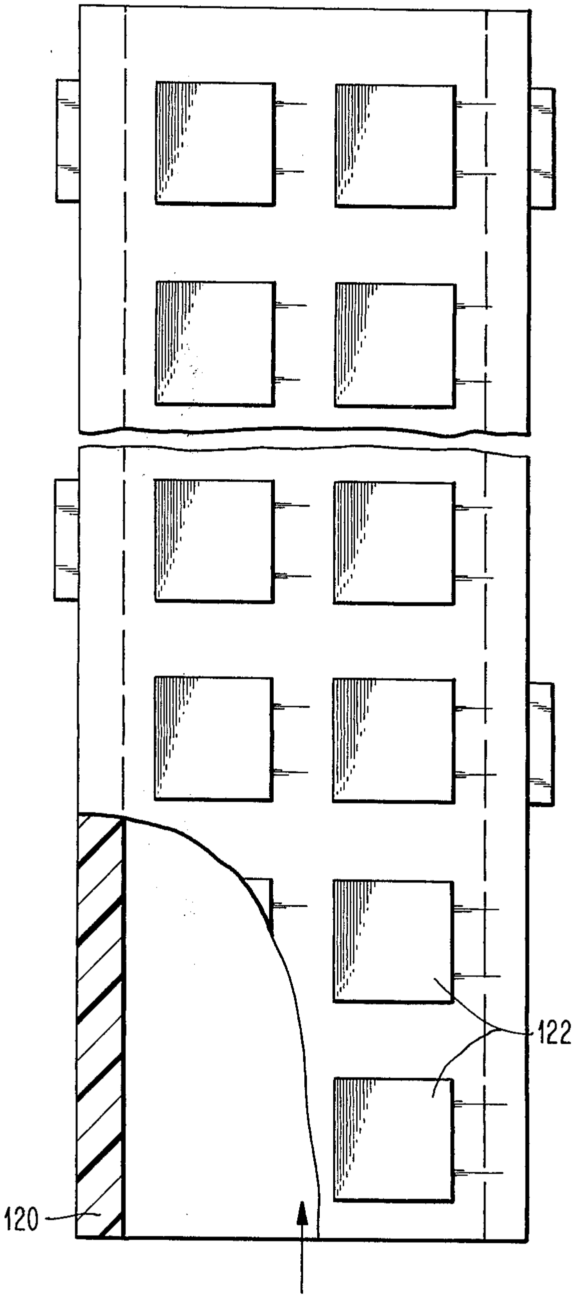
FIG. 6 is a schematic diagram partially broken away illustrating another embodiment of the invention wherein the substrate is constituted by a continuous hollow type of substrate for mounting a plurality of semiconductor chips to its multi-faced top surface metallurgical interconnection package, as contrasted to the sectionalized hollow type of substrates illustrated in FIG. 5.

Finally, FIG. 6 illustrates a continuous extruded hollow package which also can slidably engage a mounting member as that depicted in FIG. 5. The FIG. 6 embodiment is substantially identical to that depicted in FIG. 5 except that the main substrate 120 carrying the plurality of integranted circuit chips 122 is not sectionalized and is fabricated as a continuous hollow package.

While the invention *h* as been particularly shown and described with reference to the preferred embodiments thereof, it will be understood by those skilled in the art that the foregoing and other changes in form and details may be made therein without departing from the spirit and scope of the invention.

What is claimed is:

1. A package for interconnecting integrated circuit chips comprising:

a. a substrate having a plurality of intersecting planes, b. a plurality of metallized interconnection patterns located on different ones of only external surfaces of said plurality of intersecting planes, c. at least one integrated circuit chip connected to said metallized interconnection patterns on one of said planes, d. said plurality of metallized interconnection patterns located on its associated intersecting plane having at least a portion thereof connecting to an interconnection pattern located on another intersecting plane, e. input/output connectors connected to at least one of said metallized patterns for connecting to another level of packaging, f. said substrate comprises a partially open-sided body, g. a heat dissipating mounting post for slideably internally engaging a plurality of said partially open-sided substrates, said open-sided substrates being maintained in electrical contact with each other, and h. connector means connected to at least one of said substrates for connecting to another level of packaging.

2. A package for interconnecting integrated circuit chips as in claim 1 wherein:

a. said mounting post comprises a hollow body adaptable for receiving a cooling medium.

3. A package for interconnecting integrated circuit chips comprising:

a. a substrate having a plurality of intersecting planes, b. a plurality of metallized interconnection patterns located on different ones of only external surfaces of said plurality of intersecting planes, c. at least one integrated circuit chip connected to said metallized interconnection patterns on one of said planes, d. said plurality of metallized interconnection patterns located on its associated intersecting plane having at least a portion thereof connecting to an interconnection pattern located on another intersecting plane, e. input/output connectors connected to at least one of said metallized patterns for connecting to another level of packaging, f. said substrate comprises a metal core for providing heat dissipation, and a dielectric coating over said core for receiving said metallized patterns thereover,

4. A package for interconnecting integrated circuit chips as in claim 3 wherein:

a. said metal core constitutes a common ground.

* * * * *